(12) United States Patent
Saito et al.

(10) Patent No.: US 12,188,564 B2
(45) Date of Patent: Jan. 7, 2025

(54) PISTON RING, AND METHOD FOR MANUFACTURING SAME

(71) Applicant: KABUSHIKI KAISHA RIKEN, Tokyo (JP)

(72) Inventors: Hiroki Saito, Kashiwazaki (JP); Keiji Honda, Kashiwazaki (JP); Yuji Shima, Kashiwazaki (JP)

(*) Notice: Subject to any disclaimer, the term of this patent is extended or adjusted under 35 U.S.C. 154(b) by 102 days.

(21) Appl. No.: 17/793,654

(22) PCT Filed: Jan. 21, 2021

(86) PCT No.: PCT/JP2021/002102
§ 371 (c)(1),
(2) Date: Jul. 19, 2022

(87) PCT Pub. No.: WO2021/153425
PCT Pub. Date: Aug. 5, 2021

(65) Prior Publication Data
US 2023/0083774 A1  Mar. 16, 2023

(30) Foreign Application Priority Data
Jan. 27, 2020 (JP) .................. 2020-010754

(51) Int. Cl.
*F16J 9/26* (2006.01)
*C23C 14/06* (2006.01)

(52) U.S. Cl.
CPC ............. *F16J 9/26* (2013.01); *C23C 14/0641* (2013.01)

(58) Field of Classification Search
CPC ... F02F 5/00; F16J 9/26; C23C 14/022; C23C 14/0021; C23C 14/325; C23C 14/0641; C23C 14/32
See application file for complete search history.

(56) References Cited

U.S. PATENT DOCUMENTS

| 2004/0056425 | A1 | 3/2004 | Miida |
| 2008/0007006 | A1 | 1/2008 | Kawai |
| 2010/0295251 | A1* | 11/2010 | Sekiya ................ C23C 14/0641 428/141 |
| 2011/0143976 | A1 | 6/2011 | Ito et al. |

(Continued)

FOREIGN PATENT DOCUMENTS

| CN | 1492978 | 4/2004 |
| CN | 101210318 | 7/2008 |

(Continued)

OTHER PUBLICATIONS

Lin Jianliang et al., "Development and evaluation of low friction TiSiCN nanocomposite coatings for piston ring applications", Surface & Coatings Technology, Elsevier, NL, vol. 298, 2016-04-27, p. 121-p. 131.

(Continued)

*Primary Examiner* — Vishal V Vasisth
(74) *Attorney, Agent, or Firm* — SOEI PATENT & LAW FIRM

(57) ABSTRACT

A piston ring includes a substrate, and a film covering at least a part of a surface of the substrate. The film includes Si and N. A Si content of the film is in a range of 1.1 to 7.5 at %, a crystallite size of the film is in a range of 10 to 30 nm, and a compressive residual stress of the film is 400 to 800 MPa.

19 Claims, 2 Drawing Sheets

(56) References Cited

U.S. PATENT DOCUMENTS

| | | |
|---|---|---|
| 2015/0136062 A1 | 5/2015 | Tsuji et al. |
| 2017/0002454 A1 | 1/2017 | Ozaki et al. |
| 2017/0167609 A1 | 6/2017 | Chida et al. |
| 2017/0327918 A1 | 11/2017 | Da Rocha Mordente et al. |

FOREIGN PATENT DOCUMENTS

| | | |
|---|---|---|
| CN | 105765274 | 7/2016 |
| CN | 106415083 | 2/2017 |
| EP | 3657000 | 5/2020 |
| JP | 2002-266697 | 9/2002 |
| JP | 2008-014228 | 1/2008 |
| JP | 2010-016803 | 1/2010 |
| JP | 2010-070848 | 4/2010 |
| JP | 2010-168603 | 8/2010 |
| JP | 2018-150434 | 9/2018 |
| JP | 2019-066024 | 4/2019 |
| JP | 6533858 | 6/2019 |
| WO | 02/052179 | 7/2002 |
| WO | 2013/137060 | 9/2013 |
| WO | 2015/115601 | 8/2015 |
| WO | 2016/002810 | 1/2016 |

OTHER PUBLICATIONS

Extended Search Report in corresponding European Application No. 21747026.9, dated Jan. 5, 2024.

International Search Report dated Mar. 9, 2021 for PCT/JP2021/002102.

International Preliminary Report on Patentability with Written Opinion dated Aug. 11, 2022 for PCT/JP2021/002102.

* cited by examiner

PISTON RING, AND METHOD FOR MANUFACTURING SAME

CROSS-REFERENCE TO RELATED APPLICATIONS

This application is a 35 U.S.C. § 371 national phase application of PCT/JP2021/002102, filed on Jan. 21, 2021, which claims priority to Japanese Patent Application No. 2020-010754, filed on Jan. 27, 2020.

TECHNICAL FIELD

The present disclosure relates to a piston ring and a method for manufacturing the same.

BACKGROUND ART

A piston ring is used in engines of automobiles or the like. The piston ring is mounted in a groove provided in an outer peripheral surface of a piston. The piston ring is required to contribute to high performance of an engine and to a reduction in fuel consumption through characteristics such as wear resistance and seizure resistance. In the related art, various efforts have been made to improve the wear resistance of the piston ring.

For example, the invention described in Patent Literature 1 is intended to provide a sliding member having excellent wear resistance even under severe conditions in an engine to which fuel direct injection or exhaust gas recirculation (EGR) is applied. In the sliding member, a substrate is covered with a film made of a metal nitride, a metal carbide, or a metal carbonitride and having a mixed structure of a crystal phase and an amorphous phase.

The invention described in Patent Literature 2 is intended to provide a piston ring for an internal combustion engine having both wear resistance, crack resistance, and peeling resistance. A hard film containing Cr, N, and Si as constituent elements, having the same crystal structure as that of CrN, and being composed of a crystal phase in which Si is solid-solved in a crystal lattice of the crystal structure at an atomic ratio of 1% to 9.5% is formed on at least an outer peripheral sliding surface of the piston ring.

CITATION LIST

Patent Literature

Patent Literature 1: Japanese Unexamined Patent Publication No. 2002-266697
Patent Literature 2: Japanese Unexamined Patent Publication No. 2008-14228

SUMMARY OF INVENTION

Technical Problem

In recent years, for the purpose of complying with high performance of an engine and with exhaust gas regulations, for example, an increase in combustion temperature, an adoption of a low-viscosity lubricant, and a reduction in oil amount have been progressing. Accordingly, the usage environment of the piston ring has been becoming more severe and a boundary lubrication environment year by year, and an increase in the wear amount of the piston ring has become an issue. This is mainly due to an increase in resistance and an increase in thermal load during sliding caused by the thinning of an oil film.

Both Patent Literatures 1 and 2 disclose that films are formed by an ion plating method. A CrN-based film, a TiN-based film, and a laminated film thereof formed by the ion plating method improve the wear resistance and the peeling resistance of the piston ring. However, when the usage environment of the piston ring is assumed to become more severe, there is still room for improving the wear resistance and the peeling resistance of these films.

By the way, around the year 2002, the inventors developed a film in which Si is added to CrN. It was known that the film in which Si is added to CrN (hereinafter, referred to as a "Cr—Si—N-based film" in some cases) has fine crystal grains because of the addition of Si, and as a result, is dense and has a large hardness. The development policy at that time placed emphasis on improving the wear resistance of the film by increasing the hardness. However, there was a history that cracks occurring in the film could not be sufficiently suppressed and the film was not put into practical use.

The present disclosure provides a piston ring on which a film containing Si and N is provided and in which all of peeling resistance, crack resistance, and wear resistance are at a sufficiently high level, and a method for manufacturing the same.

Solution to Problem

As described above, for example, the Cr—Si—N-based film of the related art has a large hardness whereas cracks are likely to be formed in the film, which is a problem. The cracks in the film are a cause of peeling. Since the piston ring is exposed to continuous sliding and to a repeated load, it has been considered that the application of the Cr—Si—N-based film of the related art to the piston ring is difficult. However, as a result of repeating the trial production and evaluation of the piston ring, the inventors have specified conditions of a physical vapor deposition method in which a film capable of achieving all of peeling resistance, crack resistance, and wear resistance at a sufficiently high level is formed, and has completed the following inventions.

A method for manufacturing a piston ring according to the present disclosure includes: (A) a step of cleaning a surface of a substrate of the piston ring; and (B) a step of forming a film containing Si and N in a chamber using a physical vapor deposition method so as to cover at least a part of the surface of the substrate. In the step (B), a pressure in the chamber is set in a range of 2 to 6 Pa and a bias voltage is set in a range of −5 to −18 V such that the film satisfying the following conditions is formed.

<Conditions of Film>
A Si content is in a range of 1.1 to 7.5 at %.
A crystallite size is in a range of 10 to 30 nm.
A compressive residual stress is 400 to 800 MPa.

The pressure condition (2 to 6 Pa) in the chamber allows a higher pressure than that of film formation conditions of the Cr—Si—N-based film of the related art, and an absolute value (5 to 18) of the bias voltage condition (−5 to −18 V) is a smaller value than that of the film formation conditions of the Cr—Si—N-based film of the related art. In the step (B), the piston ring in which all of peeling resistance, crack resistance, and wear resistance are at a sufficiently high level can be manufactured by forming the film under conditions satisfying these values.

A piston ring according to the present disclosure includes: a substrate; and a film containing Si and N, that is provided to cover at least a part of a surface of the substrate. The film satisfies the following conditions.

<Conditions of Film>

A Si content is in a range of 1.1 to 7.5 at %.
A crystallite size is in a range of 10 to 30 nm.
A compressive residual stress is 400 to 800 MPa.

In the piston ring, when the Si content of the film is 1.1 at % or more, a merit of adding Si such as an increase in hardness can be enjoyed, and on the other hand, when the Si content is 7.5 at % or less, the occurrence of cracks in the film can be suppressed. These effects are exhibited in combination with the fact that the crystallite size and the compressive residual stress of the film are within the above respective ranges.

It is preferable that a hardness of the film is 1000 HV0.1 to 1800 HV0.1. This hardness is softer than that of the Cr—Si—N-based film of the related art, but is a hardness that is sufficient as that of the film of the piston ring. It is preferable that a ratio H/E of a hardness H (GPa) of the film obtained by a nanoindenter and a Young's modulus E (GPa) of the film is 0.04 to 0.07. When the ratio H/E is within the above range, the film can be appropriately elastically deformed, and accordingly, a Hertz stress caused by sliding is reduced, and excellent peeling resistance is achieved.

When a composition of the film is represented by Me-Si—N (Me indicates a metal element), Me is, for example, Cr. Namely, when the film containing Si and N further contains Cr, from the viewpoint of suppressing the occurrence of cracks in the film, it is preferable that a Cr content is 40 at % or more. In addition, from the viewpoint of suppressing cracks and the peeling of the film caused by the coupling of the cracks, as for crystal orientations of the film, it is preferable that a texture coefficient of CrN (111) is 0.4 or more.

Advantageous Effects of Invention

The present disclosure provides the piston ring on which the film containing Si and N is provided and in which all of peeling resistance, crack resistance, and wear resistance are at a sufficiently high level, and the method for manufacturing the same.

DESCRIPTION OF EMBODIMENTS

Hereinafter, embodiments of the present disclosure will be described in detail. Incidentally, the present invention is not limited to the following embodiments.

Piston Ring

Figure 1:
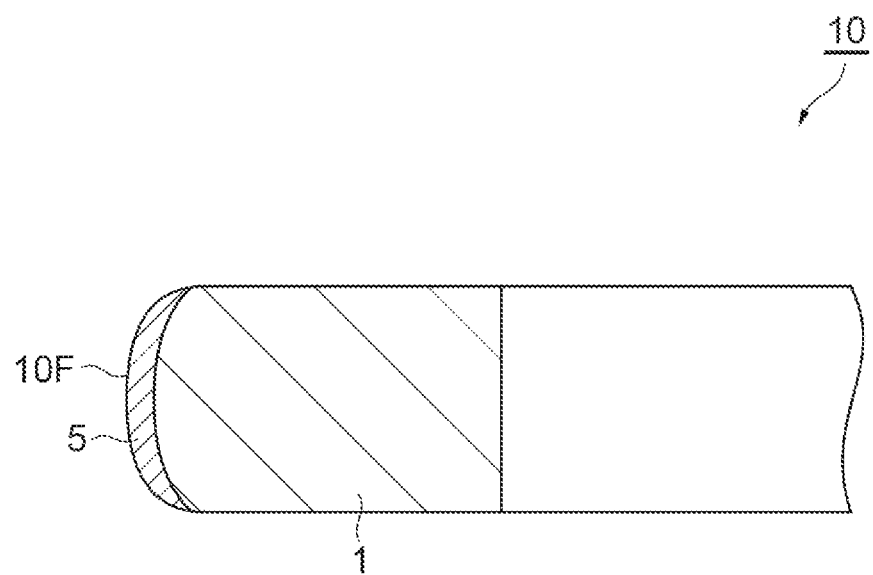
FIG. 1 is a cross-sectional view schematically showing one embodiment of a piston ring of the present disclosure.

FIG. 1 is a cross-sectional view schematically showing a piston ring according to the present embodiment. A piston ring 10 shown in FIG. 1 is a compression ring for an internal combustion engine (for example, an automobile engine). For example, the compression ring is mounted in a ring groove formed in a side surface of a piston. The compression ring is a ring exposed to particularly an environment where the thermal load of the engine is high.

The piston ring 10 has an annular shape and has, for example, an outer diameter of 40 to 300 mm. The term "annular shape" referred to here does not necessarily mean a closed circle, and the piston ring 10 may include a joint portion. In addition, the piston ring 10 may have a perfect circular shape or an elliptical shape in a plan view. The piston ring 10 has a substantially rectangular shape in the cross section shown in FIG. 1, and a sliding surface 10F may be rounded to bulge outward.

The piston ring 10 includes a substrate 1 and a film 5 provided on an outer peripheral surface (surface corresponding to the sliding surface 10F) of the substrate 1. The substrate 1 is made of an alloy having a heat resisting property. Specific examples of the alloy include spring steel, martensitic stainless steel, and the like. A nitride layer may be formed on a surface of the substrate 1.

The film 5 forms the sliding surface 10F. The film 5 is made of a Me-Si—N-based material (Me indicates a metal element). A thickness of the film 5 is, for example, 5 to 70 μm, preferably 10 to 50 μm. When the thickness of the film 5 is 5 μm or more, there is a tendency that the durability of the piston ring 10 can be increased, and on the other hand, when the thickness is 70 μm or less, a high productivity of the film 5 can be secured.

The metal element Me is, for example, Cr, Ti, Al, Zr, Nb, or the like. A Me content in the Me-Si—N-based material is preferably 40 at % or more, more preferably 40 to 55 at %, and further preferably 45 to 52 at %. When the Me content in the Me-Si—N-based material is 40 at % or more, characteristics of the metal element Me are sufficiently reflected in the film 5. The Me-Si—N-based material may contain one metal element or two or more metal elements. Among these metal elements, Cr is preferable in that an atomic radius of Cr is close to that of Si to be solid-solved.

A Si content of the film 5 is 1.1 to 7.5 at %, preferably 1.5 to 7.0 at %, and more preferably 2.0 to 5.0 at %. The film 5 having a Si content of 1.1 at % or more is composed of fine crystal grains and has excellent hardness. When the Si content of the film 5 is 7.5 at % or less, an appropriate amount of amorphous phase is likely to be formed in the film 5. It is inferred that the amorphous phase contributes to suppressing cracks. The Si content of the film 5 can be adjusted by a Si content of a target used when the film 5 is formed by a physical vapor deposition method (PVD method).

A crystallite size of the film 5 is 10 to 30 nm, preferably 15 to 25 nm. In the case of a crystallite size of 30 nm or less, even when the film 5 is worn, a wear amount at a time is reduced, and the wear resistance is improved.

A compressive residual stress of the film 5 is 400 to 800 MPa. When the residual stress (compression) of the film 5 is within the above range, a stress difference between the film 5 and the substrate 1 (an alloy or a nitride layer) can be reduced, and accordingly, peeling at an interface between the substrate 1 and the film 5 can be suppressed. In addition to the above, cracks in the film 5 that are likely to occur because of the addition of Si can be suppressed.

As for crystal orientations of the film 5, it is preferable that a texture coefficient of each crystal plane satisfies the following conditions. Balancing the crystal orientations of the film 5 can interfere with the growth of cracks and can effectively prevent the peeling of the film 5 caused by the coupling of the cracks.

CrN (111): 0.4 or more (more preferably 0.6 to 1.2)
CrN (200): 1.0 or more
CrN (220): 0.5 or more A hardness of the film 5 is preferably 1000 HV0.1 to 1800 HV0.1, more preferably 1100 HV0.1 to 1500 HV0.1. A ratio H/E of a hardness H (GPa) of the film 5 obtained by a nanoindenter and a Young's modulus E (GPa) of the film 5 is preferably 0.04 to 0.07, more preferably 0.05 to 0.06. When the ratio H/E is within the above range, the film 5 can be appropriately elastically deformed, and accordingly, a Hertz stress caused by sliding is reduced, and excellent peeling resistance is achieved.

(Method for Manufacturing Piston Ring)

Next, a method for manufacturing the piston ring 10 will be described. The manufacturing method of the present embodiments includes the following steps.

(a) A step of cleaning the surface of the substrate 1.
(b) A step of forming the film 5 satisfying the conditions using the physical vapor deposition method.

<Conditions of Film 5>

A Si content is in a range of 1.1 to 7.5 at %.
A crystallite size is in a range of 10 to 30 nm.
A compressive residual stress is 400 to 800 MPa.

The step (a) is a step of cleaning the surface of the substrate 1 prior to the formation of the film 5. For example, a cleaning process by degreasing or shot blasting may be performed. In addition to the above, bombardment cleaning may be performed in a chamber.

The formation of the film 5 in the step (b) may be performed by the physical vapor deposition method. The formation of the film 5 is performed after the inside of the chamber is set to a nitrogen atmosphere. Examples of the physical vapor deposition method include an ion plating method, a sputtering method, and the like. All of these physical vapor deposition methods are performed in a vacuum chamber, and a nitrogen pressure of the vacuum chamber is set in a range of 2 to 6 Pa. In addition, a bias voltage is set in a range of −5 to −18 V.

The Si content of the film 5 can be adjusted by changing a Si content of a target. The Si content of the film 5 may be adjusted by supplying a Si-containing gas into the chamber. The hardness of the film 5 can be adjusted, and the crystal orientations and the crystallite size can be adjusted by the Si content of the film 5. The physical properties of the film 5 can be adjusted by a temperature when the film 5 is formed (film forming temperature). The film forming temperature may be, for example, 550° C. or less. The residual stress and the hardness of the film 5 may be adjusted by adjusting the nitrogen pressure in the chamber and the bias voltage.

At least one of the following conditions may be adopted to form the film 5 that is relatively soft even though the film 5 contains Si.

The nitrogen pressure in the chamber is set to be high. The pressure is, for example, 4.0 to 6.0 Pa.

The bias voltage (absolute value) is set to a small value. The bias voltage is, for example, −5 to −10 V.

According to the manufacturing method, the piston ring 10 in which all of peeling resistance, crack resistance, and wear resistance are at a sufficiently high level can be manufactured.

Examples

Hereinafter, the present disclosure will be described in more detail based on examples and comparative examples. The present invention is not limited to the following examples.

As substrates of piston rings, rings having the following composition were prepared.

Fe: 80.4 mass %
C: 0.85 mass %
Cr: 17.0 mass %
Si: 0.5 mass %
Mn: 0.5 mass %
Other elements: remainder Examples 1 to 9 and Comparative Examples 1 to 6

The piston rings according to examples and comparative examples were produced as follows. Namely, first, the substrates were degreased and cleaned and then installed in a chamber. Next, the substrates in the chamber were subjected to bombardment cleaning. Thereafter, a film (thickness: approximately 20 μm) was formed on a surface of each of the substrates under the conditions shown in Tables 1 and 2 by the ion plating method. Note that the film formation temperature was set to 500° C. An arc current was set to 150 A.

<Film Characteristics>

Tables 1 and 2 show characteristics of the films of the piston rings according to the examples and the comparative examples. Note that each characteristic was measured by the following methods.

Si Content

A Si content of the films was measured using EPMA (device name: JXA-8100 and manufactured by JEOL Ltd.) under measurement conditions where an acceleration voltage was set to 15 kV, an irradiation current was set to $5.0 \times 10^{-8}$ A, and a beam diameter was set to 10 μm. Incidentally, from X-ray diffraction data, it was determined that Si in the films of the examples and the comparative examples (excluding Comparative Example 4) was solid-solved.

Crystal Orientation

Crystal orientations of the films were evaluated by a texture coefficient of each crystal plane obtained from X-ray diffraction data obtained by an X-ray diffractometer (device name: SmartLab and manufactured by Rigaku Corporation). The texture coefficient of each crystal plane was obtained by the following equation.

$$\text{Texture coefficient} = [l(hkl)/l_0(hkl)] / [\Sigma\{l(hkl)/l_0(hkl)\}/n]$$

In the equation, l (hkl) is an X-ray diffraction intensity of a measured plane (hkl), and $l_0$ (hkl) is a standard X-ray diffraction intensity described in the JCPDS file.

Residual Stress

A residual stress of the films was measured using an X-ray stress measurement device (device name: PSPC micro-area X-ray residual stress measurement system and manufactured by Rigaku Corporation).

Since the relationship of the following equation is established, the residual stress was obtained using a slope of a straight line of a diffraction angle 2θ and sin 2φ (φ is an angle between a sample surface normal direction and a diffraction surface normal direction).

$$\sigma(\text{residual stress}) = K \cdot \partial(2\theta)/\partial(\sin 2\varphi)$$

In the equation, K is a stress constant (obtained from a Young's modulus, a Poisson's ratio, and a reflection angle θ in a non-distorted state), and −762 MPa was used. The measurement was performed by an iso-inclination method under conditions where a Cr target X-ray tube was used, a voltage was set to 35 kV, a current was set to 40 mA, a collimator of 1 mm was used, six points (0, 18, 27, 33, 39, and 45 deg.) were set as φ, a measurement time was set to 90 seconds, and a diffraction angle CrN (311), 2θ was set to 132.86°. Incidentally, the negative notation in Tables 1 and 2 means a compressive residual stress.

Hardness

A hardness of the films was obtained by performing a hardness test with a test load of 0.98 N using a Vickers hardness tester (device name: HM-220 and manufactured by Mitutoyo Corporation) based on the method specified in ISO6507.

Hardness H and Young's Modulus E

The hardness H of the films and the Young's modulus E of the films obtained by a nanoindenter were obtained using a nanoindentation hardness tester (device name: ENT-1100a and manufactured by ELIONIX INC.). Namely, a hardness test was performed with a test load of 0.4 N using a diamond indenter of which the tip shape is a regular triangular pyramid shape (Berkovich type), based on the test method specified in ISO14577, and the hardness H and the Young's modulus E of the films were obtained from a "load-displacement curve" obtained from the load applied to the indenter and a displacement of the indenter during the test.

Crystallite Size

A crystallite size of the films was calculated on a CrN (200) plane using the X-ray diffractometer (device name: SmartLab and manufactured by Rigaku Corporation) and using the following Scherrer equation.

$$\text{crystallite size} = K\lambda/\beta \cos\theta$$

In the equation, K is a Scherrer constant and is 0.94, λ is a wavelength of X-rays (Cu: 1.5406 Å), β is a half value width, and θ is a Bragg angle.

<Sliding Fatigue Test>

Figure 2:
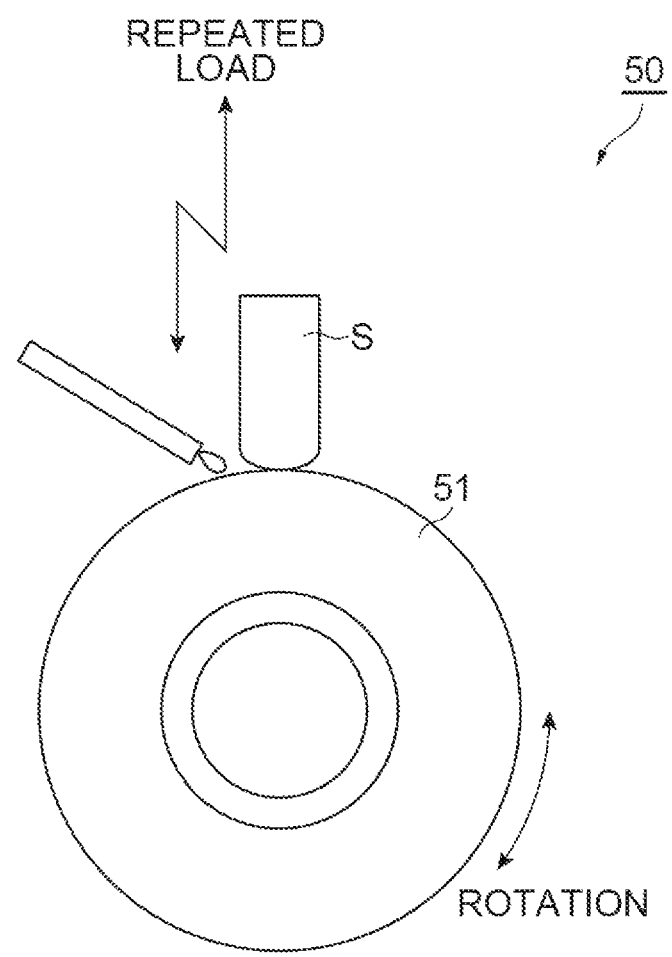
FIG. 2 is a schematic view showing a configuration of a sliding fatigue tester.

As an accelerated wear test, a sliding fatigue test was performed using a tester of the configuration shown in FIG. 2. A tester 50 shown in FIG. 2 includes a drum 51 that is rotatable, a mechanism that brings a test piece S (piston ring cut piece) into contact with a surface of the drum 51, a mechanism that repeatedly applies a load to the test piece S, and a mechanism that supplies a lubricant to a sliding portion. Accordingly, the test piece can be worn in a relatively short time. Test conditions are as follows.

Test load: 20 to 50 N and sine curve (50 Hz)
Mating material (drum): SUJ2 thermal refined material (diameter 80 mm)
Dynamic speed: Forward and reverse trapezoidal pattern operation
Lubricant: Base oil (0.1 cc is dripped once every 30 seconds) Drum surface temperature: 80° C.
Test time: Five cycles, where one cycle is 2 min to 3 min <Evaluation>

20 piston rings according to each of the examples and the comparative examples were produced, and a sliding fatigue test was performed on the piston rings as evaluation targets 20 times. The films after the sliding fatigue test were visually observed to evaluate the peeling resistance and the crack resistance of the films. The wear resistance was evaluated based on a wear amount of the films of Comparative Example 4. Evaluation criteria were as follows.

Peeling Resistance

A: Among the 20 samples, a peeling occurrence rate is 40% or less.
B: Among the 20 samples, a peeling occurrence rate is more than 40% and less than 80%.
C: Among the 20 samples, a peeling occurrence rate is 80% or more.

Crack Resistance

A: Among the 20 samples, a crack occurrence rate is 35% or less.
B: Among the 20 samples, a crack occurrence rate is more than 35% and less than 90%.
C: Among the 20 samples, a crack occurrence rate is 90% or more.

Wear Resistance

A wear amount when a wear amount of a CrN film of the related art is 1.0.
A: A wear amount is 0.7 or less.
B: A wear amount is more than 0.7 and less than 0.9.
C: A wear amount is 0.9 or more.

| | | Example 1 | Example 2 | Example 3 | Example 4 | Example 5 | Example 6 | Example 7 | Example 8 | Example 9 |
|---|---|---|---|---|---|---|---|---|---|---|
| Composition of target | Cr content (at %) | 95 | 93 | 92 | 90 | 86 | 83 | 80 | 90 | 90 |
| | Si content (at %) | 5 | 7 | 8 | 10 | 14 | 17 | 20 | 10 | 10 |
| Chamber | Pressure (Pa) | 4.0 | 4.0 | 4.0 | 4.0 | 4.0 | 4.0 | 4.0 | 2.0 | 6.0 |
| | Atmosphere | $N_2$ | $N_2$ | $N_2$ | $N_2$ | $N_2$ | $N_2$ | $N_2$ | $N_2$ | $N_2$ |
| Bias voltage (V) | | −10 | −10 | −10 | −10 | −10 | −10 | −10 | −5 | −18 |
| Film characteristics | Constituent element | CrSiN | CrSiN | CrSiN | CrSiN | CrSiN | CrSiN | CrSiN | CrSiN | CrSiN |
| | Si content (at %) | 1.3 | 2.6 | 2.9 | 3.6 | 4.7 | 5.8 | 7.1 | 3.3 | 3.1 |
| Texture coefficient | CrN (111) | 0.8 | 0.8 | 0.8 | 0.8 | 0.8 | 0.6 | 0.6 | 0.5 | 0.4 |
| | CrN (200) | 1.5 | 1.3 | 1.2 | 1.2 | 1.1 | 1.1 | 1.0 | 1.7 | 1.5 |
| | CrN (220) | 0.7 | 0.9 | 1.0 | 1.0 | 1.1 | 1.4 | 1.3 | 0.7 | 1.0 |

-continued

|  | Example 1 | Example 2 | Example 3 | Example 4 | Example 5 | Example 6 | Example 7 | Example 8 | Example 9 |
|---|---|---|---|---|---|---|---|---|---|
| Residual stress (MPa) | −615 | −639 | −650 | −634 | −613 | −695 | −721 | −453 | −409 |
| Hardness (HV0.1) | 1286 | 1324 | 1498 | 1419 | 1495 | 1743 | 1793 | 1167 | 1073 |
| Hardness/Young's modulus | 0.051 | 0.050 | 0.052 | 0.047 | 0.051 | 0.056 | 0.058 | 0.053 | 0.045 |
| Crystallite size (nm) | 27.4 | 22.4 | 20.4 | 19.7 | 18.2 | 14.6 | 14.6 | 21.5 | 20.3 |
| Evaluation result — Peeling resistance | A | A | A | A | A | A | A | A | A |
| Crack resistance | B | B | A | A | B | A | A | B | B |
| Wear resistance | B | A | A | A | A | A | A | A | B |

TABLE 2

|  |  | Comparative Example 1 | Comparative Example 2 | Comparative Example 3 | Comparative Example 4 | Comparative Example 5 | Comparative Example 6 |
|---|---|---|---|---|---|---|---|
| Composition of target | Cr content (at %) | 90 | 90 | 90 | 100 | 99 | 97 |
|  | Si content (at %) | 10 | 10 | 10 | 0 | 1 | 3 |
| Chamber | Pressure (Pa) | 4.0 | 1.5 | 1.5 | 4.0 | 4.0 | 4.0 |
|  | Atmosphere | $N_2$ | $N_2$ | $N_2$ | $N_2$ | $N_2$ | $N_2$ |
|  | Bias voltage (V) | −20 | 0 | −10 | −10 | −10 | −10 |
| Film characteristics | Constituent element | CrSiN | CrSiN | CrSiN | CrN | CrSiN | CrSiN |
|  | Si content (at %) | 3.4 | 3.2 | 3.3 | - | 0.2 | 0.4 |
| Texture coefficient | CrN (111) | 0.6 | 1.0 | 1.1 | 0.4 | 0.7 | 0.7 |
|  | CrN (200) | 2.0 | 1.5 | 1.4 | 2.3 | 1.9 | 1.7 |
|  | CrN (220) | 0.4 | 0.5 | 0.6 | 0.3 | 0.4 | 0.6 |
|  | Residual stress (MPa) | −914 | −834 | −1050 | −376 | −671 | −624 |
|  | Hardness (HV0.1) | 1449 | 1596 | 1780 | 1008 | 1278 | 1254 |
|  | Hardness/Young's modulus | 0.063 | 0.053 | 0.054 | 0.038 | 0.053 | 0.051 |
|  | Crystallite size (nm) | 23.0 | 18.9 | 19.2 | 33.1 | 31.8 | 31.4 |
| Evaluation result | Peeling resistance | C | C | c | B | B | B |
|  | Crack resistance | B | B | B | C | C | C |
|  | Wear resistance | B | B | A | C | C | C |

INDUSTRIAL APPLICABILITY

The present disclosure provides the piston ring on which the film containing Si and N is provided and in which all of peeling resistance, crack resistance, and wear resistance are at a sufficiently high level, and the method for manufacturing the same.

REFERENCE SIGNS LIST

1: substrate, 5: film, 10: piston ring, 10F: sliding surface.

The invention claimed is:

1. A piston ring comprising:
a substrate; and
a film covering at least a part of a surface of the substrate, wherein the film comprises Cr, Si and N, and
wherein:
a Si content of the film is in a range of 1.1 to 7.5 at %,
a crystallite size of the film is in a range of 10 to 30 nm, and
a compressive residual stress of the film is 400 to 800 MPa.

2. A method for manufacturing the piston ring according to claim 1, the method comprising:
cleaning the surface of the substrate of the piston ring; and
forming the film comprising Cr, Si and N in a chamber using a physical vapor deposition method so as to cover at least the part of the surface of the substrate,
wherein a nitrogen pressure in the chamber is set in a range of 2 to 6 Pa,
wherein the film is formed with a bias voltage set in a range of −5 to −18 V, and
wherein:
the Si content of the film is in a range of 1.1 to 7.5 at %,
the crystallite size of the film is in a range of 10 to 30 nm, and
the compressive residual stress of the film is 400 to 800 MPa.

3. The method according to claim 2, wherein a hardness of the film is 1000 HV0.1 to 1800 HV0.1.

4. The piston ring according to claim 1, wherein a Cr content of the film is 40 at % or more.

5. The piston ring according to claim 1, wherein a texture coefficient of CrN (111) of the film is 0.4 or more.

6. The piston ring according to claim 1, wherein a hardness of the film is 1000 HV0.1 to 1800 HV0.1.

7. The piston ring according to claim 1, wherein a ratio H/E of a hardness H (GPa) of the film obtained by a nanoindenter, to a Young's modulus E (GPa) of the film is 0.04 to 0.07.

8. The piston ring according to claim 1, wherein the crystallite size of the film is in a range of 15 to 30 nm.

9. The piston ring according to claim 1, wherein the Si content of the film is in a range of 2.0 to 5.0 at %.

10. The method according to claim 2, wherein the crystallite size of the film is in a range of 15 to 30 nm.

11. The method according to claim 2, wherein the Si content of the film is in a range of 2.0 to 5.0 at %.

12. A film to cover a substrate of a piston ring, the film comprising Cr, Si and N,
wherein a Si content of the film is in a range of 1.1 to 7.5 at %, wherein the film has a crystallite size in a range of 10 to 30 nm, and wherein the film has a compressive residual stress of 400 to 800 MPa.

13. The film according to claim 12, wherein a Cr content of the film is 40 at % or more, and wherein a texture coefficient of CrN (111) of the film is 0.4 or more.

14. The film according to claim 12, wherein the crystallite size of the film is in a range of 15 to 30 nm.

15. The film according to claim 12, wherein the Si content of the film is in a range of 2.0 to 5.0 at %.

16. The film according to claim 12, wherein the film has a hardness of 1000 HV0.1 to 1800 HV0.1.

17. The film according to claim 12, wherein a ratio H/E of a hardness H (GPa) of the film obtained by nanoindenter, to a Young's modulus E (GPa) of the film is 0.04 to 0.07.

18. The film according to claim 12, wherein the crystallite size of the film is in a range of 15 to 30 nm, as determined on a CrN (200) plane.

19. The piston ring according to claim 1, wherein the crystallite size of the film is in a range of 15 to 30 nm, as determined on a CrN (200) plane.

\* \* \* \* \*